United States Patent
Agui et al.

Patent Number: 5,916,375
Date of Patent: Jun. 29, 1999

[54] METHOD OF PRODUCING PHOTOELECTRIC CONVERSION DEVICE

[75] Inventors: Takaaki Agui; Tatsuya Takamoto, both of Saitama-ken, Japan

[73] Assignee: Japan Energy Corporation, Tokyo, Japan

[21] Appl. No.: 08/906,541

[22] PCT Filed: Nov. 22, 1996

[86] PCT No.: PCT/JP96/03428

§ 371 Date: Apr. 6, 1998

§ 102(e) Date: Apr. 6, 1998

[87] PCT Pub. No.: WO97/21252

PCT Pub. Date: Jun. 12, 1997

[30] Foreign Application Priority Data

Dec. 7, 1995 [JP] Japan .................................. 7-319338

[51] Int. Cl.$^6$ .................................................. H01L 21/477
[52] U.S. Cl. .............................. 136/258; 438/85; 438/89; 438/97
[58] Field of Search ........................ 136/258 PC; 438/85, 438/89, 97

[56] References Cited

FOREIGN PATENT DOCUMENTS

| | | |
|---|---|---|
| 58-118169 | 7/1983 | Japan . |
| 6-188455 | 7/1994 | Japan . |
| 7-226526 | 8/1995 | Japan . |
| 8-078707 | 3/1996 | Japan . |
| WO 93/14523 | 7/1993 | WIPO . |
| WO 93/14524 | 7/1993 | WIPO . |

*Primary Examiner*—Mark Chapman
*Attorney, Agent, or Firm*—McDonnell Boehnen Hulbert & Berghoff

[57] ABSTRACT

The present invention is directed to a method of manufacturing a photovoltaic cell with high conversion efficiency, wherein a polycrystal CdTe layer with a large grain size can be formed by forming an indium oxide film (20) on a transparent conductive substrate having a transparent conductive film (2) as its surface layer, then forming an n-type CdS layer (3) and a p-type CdTe layer (4) thereon, then attaching cadmium chloride ($CdCl_2$) on the p-type CdTe layer, and then annealing. The indium oxide film (20) is capable of relaxing strain caused at an interface between the transparent conductive film (2) and the n-type CdS layer (3), so that a good CdS/CdTe junction interface can be formed. The indium oxide film (20) can be formed by forming an indium film on the transparent conductive substrate and then annealing in oxygen containing atmosphere.

15 Claims, 5 Drawing Sheets

METHOD OF PRODUCING PHOTOELECTRIC CONVERSION DEVICE

BACKGROUND OF THE INVENTION

1. Field of the Invention

The present invention relates to a photovoltaic cell for converting solarlight energy into electrical energy and, more particularly, a manufacturing method to enhance conversion efficiency of a photoelectric conversion device such as a thin film photovoltaic cell, which employs a CdTe thin film formed on a transparent substrate such as a glass substrate as a light absorber layer.

2. Description of the Prior Art

It has been well known that CdTe has a high absorption coefficient of more than $10^4$ cm$^{-1}$ and its thin film of about 5 μm thickness is capable of sufficiently absorbing the solarlight. The CdTe thin film is promising as material for the thin film photovoltaic cell since it is easy to form a polycrystal film of high quality by virtue of various thin film forming methods such as a printing method, a plating method, an evaporation method, etc. In addition, a band gap of CdTe (~1.47 eV) is most suitable for solarlight spectrum amongst various materials for the photovoltaic cell, and thus the highest conversion efficiency can be expected. It has also been calculated that theoretical efficiency of a CdTe thin film photovoltaic cell is in excess of 20%. However, the highest value of the conversion efficiency of the CdTe thin film photovoltaic cell which has been reported up to now is about 15%, which is largely different from a theoretical value. Like the above, the photovoltaic cell employing the CdTe thin film as the light absorber layer has been expected as the low cost and high efficiency photovoltaic cell, but it is difficult under the existing circumstances to manufacture the photovoltaic cell which employs the CdTe thin film having sufficiently high conversion efficiency as the light absorber layer with good reproducibility.

As the photovoltaic cell employing the CdTe thin film as the light absorber layer in the prior art, a pn junction photovoltaic cell is common which is formed by depositing a p-type CdTe layer 4 on an n-type CdS layer 3, as shown in FIG. 1. Though illustrated upside down in FIG. 1, a transparent conductive film 2 such as an indium-tin oxide film (ITO film) is formed on a glass substrate 1, then the n-type CdS layer 3 is formed 0.1 to 10 μm thick thereon, then the p-type CdTe layer 4 is formed 1 to 10 μm thick thereon, and then an ohmic electrode 5 made of Cu/Au, etc. is formed thereon. If a sheet resistance of the CdS layer 3 is sufficiently small, the transparent conductive film 2 may be omitted.

In the prior art, the CdTe/CdS photovoltaic cell shown in FIG. 1 has been manufactured according to manufacturing steps described in the following. That is, the cell has been manufactured according to following steps (1) to (5) (this is called "a first manufacturing method in the prior art" hereinafter):

(1) The transparent conductive film 2 such as the indium-tin oxide (ITO) is deposited by the sputtering method, etc. on the glass substrate 1 such as a Corning 7059 substrate to have a thickness of about 150 nm to 1 μm such that a sheet resistance of less than 10 Ω/□ can be given.

(2) The n-type CdS layer 3 is deposited by the vacuum evaporation method, etc. at a substrate temperature 350° C. to have a thickness of 0.1 to 10 μm. If a sheet resistance of the CdS layer 3 is enoughly small, there is no necessity of the above transparent conductive film 2.

(3) Next, either CdTe molecules or Cd and Te with corresponding mole fraction are deposited 1 to 10 μm thick by means of a screen printing method, an electrolytic plating method, a spray method, or the like.

(4) Cadmium chloride (CdCl$_2$) or chlorine (Cl$_2$) is then mixed with or added to such CdTe molecules or Cd and Te with corresponding mole fraction in proper quantity. In turn, a resultant structure is annealed in an air or an inert gas at a temperature of 350 to 700° C. for about 0.1 to 2 hours to thus obtain the p-type CdTe layer 4 which has a substantially equal stoichiometry.

(5) Finally, the ohmic electrode 5 is formed on the p-type CdTe layer 4. For instances a composite film made up of a 10 nm thick Cu layer and a 100 nm thick Au layer may be used as the ohmic electrode 5.

The CdTe/CdS photovoltaic cell shown in FIG. 1 can also be manufactured according to following manufacturing steps (this is called "a second manufacturing method in the prior art" hereinafter). That is, according to the second manufacturing method in the prior art, the CdTe/CdS photovoltaic cell has been manufactured based on following steps (1) to (5):

(1) The transparent conductive film 2 such as the ITO film is deposited about 200 nm thick by the sputtering method, etc. on the glass substrate 1 such as the Corning 7059 substrate.

(2) The n-type CdS film layer is deposited by the vacuum evaporation methods etc. at a substrate temperature 350° C. to have a thickness of 0.1 to 10 μm, e.g., a thickness of 0.15 μM.

(3) A p-type CdTe layer is formed by the vacuum evaporation method at a substrate temperature 350° C. to have a thickness of about 4 μm.

(4) The p-type CdTe layer is dipped in a methanol (CH$_3$OH) solution containing copper chloride (CuCl$_2$) or a CH$_3$OH solution containing CuCl$_2$ and CdCl$_2$, then is dried by natural drying, and then is annealed at 400° C. for 15 minutes in an N$_2$+O$_2$ (4:1) atmosphere.

(5) A surface of the CdTe layer is etched by using a K$_2$Cr$_2$O$_7$+H$_2$SO$_4$+H$_2$O solution, etc., then Cu (10 nm)/Au (100 nm) are deposited by the vacuum evaporation, and then annealed at 150 ° C. for three hours in the air, whereby resulting in the ohmic electrode 5.

In the prior art, it has been appreciated that the cadmium chloride (CdCl$_2$), the copper chloride (CuCl$_2$), or the chlorine (Cl$_2$) which is used in the step (4) in the above first and second manufacturing methods can provide such advantages that the CdS layer 3 and the CdTe layer 4 serving as polycrystal films are grown in grain size several times to several tens times larger than before, conductivity of the CdTe layer 4 is changed into p-type conductivity so as to form a pn junction between the n-type CdS and the p-type CdTe, and interfacial diffusion through the CdS/CdTe junction is facilitated to form a gradient composition layer so that generation of the defects due to the lattice mismatching can be prevented. In this manner, the case is popular in the methods in the prior art where either chloride such as cadmium chloride or chlorine is introduced during deposition of either the CdTe molecules or Cd and Te with corresponding mole fraction. In this case, in order to enhance photoelectric conversion efficiency of the CdTe photovoltaic cell, the chloride or chlorine has to be controlled to its optimum amount according to respective different deposition methods. The optimum amount must not be too much reduced nor increased, and it must be controlled to proper quantity.

In the above method of manufacturing the CdTe/CdS photovoltaic cell in the prior art, there has been such a problem that, when the CdS layer 3 and the CdTe layer 4 are grown in grain size approximately ten times in the above step (4), strain is caused at an interface between the transparent conductive film 2 and the CdS layer 3 and subsequently this strain causes another strain at the CdS/CdTe junction interface, thereby decreasing an open-circuit voltage Voc and a fill factor FF of the CdTe photovoltaic cell. Hence it is difficult to manufacture the CdTe/CdS photovoltaic cell having sufficiently high conversion efficiency with good reproducibility.

Although, as will be described in detail later, the present invention includes formation of a thin film such as an indium oxide film ($In_2O_3$ film), a tin oxide film ($SnO_2$ film), or the like between a conductive substrate and an n-type semiconductor layer as one of features, techniques have been set forth in Patent Application Publications (KOHYOs) 8-500209 and 8-500210 wherein a high conductivity conductive layer such as tin oxide and a low conductivity conductive layer are formed on the glass substrate and then an n-type semiconductor layer (n-type CdS layer) is formed thereon. However, in order to improve quantum efficiency with respect to short wavelength light, these techniques have been employed to make the CdS layer extremely thin and therefore such techniques substantially differ from the present invention. In other words, the low conductivity conductive layers which have been set forth in Patent Application Publications (KOHYOs) 8-500209 and 8-500210 are associated with a technique to avoid a disadvantage caused by pinholes, etc. generated in the CdS layer when the CdS layer is made extremely thin less than 50 nm. More particularly, the low conductivity conductive layers are needed as an n-type backup heterojunction material to avoid short circuit of the photovoltaic cell due to the pinholes, etc. in the CdS layer whereas the high conductivity conductive layers are respectively such layers that are necessary to make ohmic contact between the low conductivity conductive layer and the electrode layer of the photovoltaic cell. In these documents, an electric power is in fact generated between the low conductivity conductive layer and the p-type CdTe layer and thus there are descriptions to the effect that the CdS layer may be removed completely. Accordingly, it can be understood from these descriptions that the techniques set forth in the above Patent Application Publication (KOHYO) 8-500209, etc. are different techniques from the present invention, which have objects, functions, and effectivenesses being different from those of the present invention.

SUMMARY OF THE INVENTION

The present invention has been made to remove the above drawbacks, and it is an object of the present invention to provide a manufacturing method which is able to provide a photoelectric conversion device with sufficiently high conversion efficiency.

In order to achieve the above object, as shown in FIGS. 2A to 2G, the method of manufacturing the photoelectric conversion device according to the present invention is characterized by comprising at least, (a) a first step of forming an indium oxide film ($In_2O_3$ film), a tin oxide film ($SnO_2$ film), or an indium-tin film (ITO film) 20 by forming a film made of an indium film (In film), a tin film (Sn film), or an indium-tin alloy film (In-Sn alloy film) on a transparent conductive substrate and then by annealing the film at an oxidizing temperature (usually, 300 to 500° C.) for oxidizing time (usually, within one hour) in oxygen containing atmosphere (FIG. 2C).

(b) a second step of forming an n-type semiconductor layer 3 on the $In_2O_3$ film, the $SnO_2$ film, or the ITO film 20 and then forming a p-type semiconductor layer 4 on the n-type semiconductor layer 3 (FIG. 2D, FIG. 2E), and (c) a third step of enlarging grain size of polycrystals of the p-type semiconductor layer 4 (FIG. 2F). In this event, it is preferable that the transparent conductive substrate is formed by forming a transparent conductive film 2 on a transparent substrate 1 such as the glass substrate. The ITO film, zinc oxide (ZnO) film, or $SnO_2$ film may be used as the transparent conductive film 2. In addition, CdS, CdZnS, ZnS, or the like is desirable for the n-type semiconductor layer 3 and also CdTe, $CuInSe_2$, CuInGaSeS, or the like is desirable for the p-type semiconductor layer 4. If CdTe is employed as the p-type semiconductor layer 4, the step of enlarging grain size of polycrystals in the third step may be carried out by forming a chloride layer 41 on the p-type semiconductor layer 4 and then annealing, otherwise annealing under a chlorine vapor pressure. If CuInSe is employed as the p-type semiconductor layer 4, the step of enlarging grain size of polycrystals may be carried out by forming a layer 41 made of selenium, selenide, sulfur, or sulfide on the p-type semiconductor layer 4 and then annealing, otherwise annealing under a selenium or sulfur vapor pressure. Although cadmium chloride ($CdCl_2$) is desirable for the chloride 41, other chlorides may be employed and likewise chlorine ($Cl_2$) itself may be employed.

In order to adsorb $CdCl_2$ on the p-type semiconductor layer 4, after a methanol solution containing $CdCl_2$ is coated on the p-type semiconductor layer 4, the layer 4 is dried by virtue of natural drying or else warmed in a sealed vessel which can shut off the ambient air. In particular, in order to attach a large amount of $CdCl_2$ in excess of 0.1 mg/cm$^2$, the method of warming the layer 4 in the sealed vessel is preferable. A vessel such as schale which has a slightly lower sealing degree may be employed as the sealed vessel, or another vessel which is able to seal more perfectly may be employed. A large amount of $CdCl_2$ can be attached to the surface of the p-type semiconductor layer 4 with good inplane uniformity and in a short time by drying the methanol containing $CdCl_2$ in the sealed vessel.

Preferably, a thickness of the In film, the Sn film, or the In-Sn alloy film in the first step shown in FIG. 2C should be selected in the range of 2.5 nm to 100 nm, especially 2.5 nm to 50 nm, and also the In film, the Sn film, or the In-Sn alloy film should be formed by the vacuum evaporation method. An oxide film, which is formed by annealing the In film, the Sn film, or the In-Sn alloy film in oxygen containing atmosphere, has a surface in which a grain structure having uniform grain sizes can be achieved. Such surface is different from the surface which is obtained when the oxide film is formed by the sputtering method, etc. and has non-uniform grain sizes and squarish grain shape therein. This structure seems to contribute to advantages of the present invention. If the thickness of the In film, the Sn film, or the In-Sn alloy film is set to less than 100 nm, the surface which includes the grain structure having highly uniform grain sizes can be achieved. In addition, the thickness of the In film, the Sn film, or the In-Sn alloy film in excess of 2.5 nm is preferable since a short-circuit current Isc is increased along with the thickness if the thickness exceeds 2.5 nm. Conversely, since the open-circuit voltage Voc is decreased if the thickness is made thick, it is preferable that the thickness is set to less than 50 nm. It is also preferable that the thickness of the In film, the Sn film, or the In-Sn alloy film is selected not to cause the problem of optical absorption.

In the present invention, because the $In_2O_3$ film, the $SnO_2$ film, or the ITO film 20 is formed on the transparent conductive film 2 in the first step shown in FIG. 2C, the pn junction interface between the n-type semiconductor layer 3 and the p-type semiconductor layer 4 can be prevented from being distorted when the n-type semiconductor layer 3 such as the CdS film and the p-type semiconductor layer 4 such as the CdTe film are grown in grain size in the third step shown in FIG. 2F. This is because the $In_2O_3$ film, the $SnO_2$ film, or the ITO film 20 may operate as a buffer layer between the transparent conductive film and the n-type semiconductor layer 3 to relax strain between them. Consequently, the pn junction made up of good heterojunction such as CdS/CdTe junction can be obtained, so that crystal defects to trap carriers at a low electric field can be reduced. As a result, the high performance photoelectric conversion device such as CdTe/CdS can be accomplished. In more detail, because the $In_2O_3$ film, the $SnO_2$ film, or the ITO film 20 is formed between the conductive substrate and the n-type semiconductor layer, a reverse saturation current of the diode can be reduced and the voltage Voc is increased. In addition, a diode factor upon irradiating the light, i.e., an n value can be reduced while the fill factor FF can be improved.

As described above, the techniques disclosed in Patent Application Publications (KOHYOs) 8-500209 and 8-500210 are different techniques from the present invention to achieve different objects from that of the present invention. However, according to the present invention, the photoelectric conversion device with considerably high efficiency and high uniformity rather than the photovoltaic cell set forth in these publications can be achieved.

A conductivity of the $In_2O_3$ film, the $SnO_2$ film, or the ITO film 20 may be 0.1 $\Omega/cm^2$ when its thickness is about 10 nm. In other words, resistivity of the $In_2O_3$ film, the $SnO_2$ film, or the ITO film 20 may be employed if it is less than 105 $\Omega \cdot cm$. Usually such degree of resistivity can be readily attained.

DETAILED DESCRIPTION OF THE INVENTION

Best modes for carrying out the invention will be explained with reference to accompanying drawings hereinafter.

(First Embodiment)

FIGS. 2A to 2G are views illustrating a method of manufacturing a CdTe/CdS photovoltaic cell according to a first embodiment of the present invention. In the first embodiment of the present invention, following steps are taken.

Figure 1:
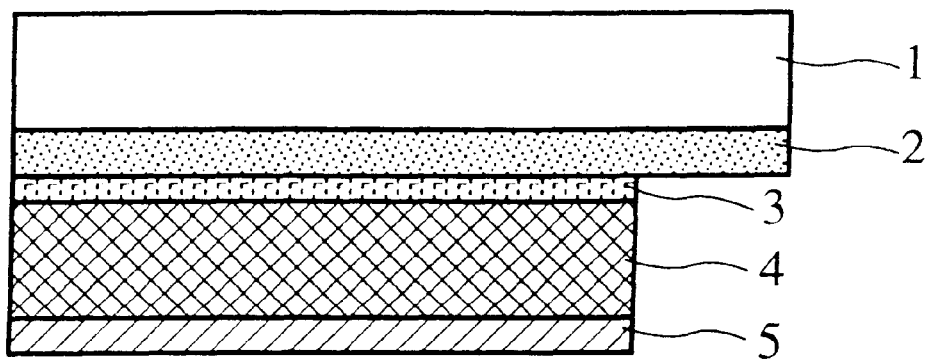
FIG. 1 is a schematic view showing a cross-sectional shape of a CdTe/CdS photovoltaic cell in the prior art.
Figure 2A:
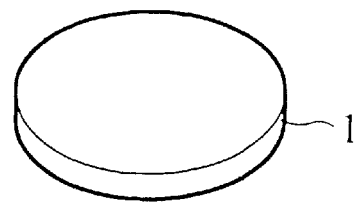
FIGS. 2A to 2G are views illustrating a method of manufacturing a CdTe/CdS photovoltaic cell according to a first embodiment of the present invention.
Figure 2B:
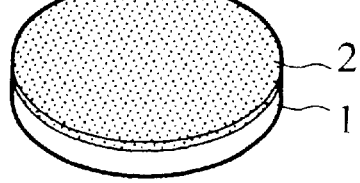

(1) After a transparent substrate 1, e.g., a Corning 7059 substrate is cleaned, as shown in FIG. 2B, an indium-tin oxide film (ITO film) 2 is then formed 200 nm thick as a transparent conductive film by the sputtering method.

Figure 2C:
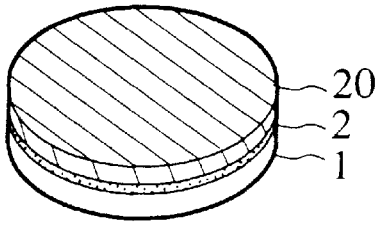

(2) Then, as shown in FIG. 2C, an indium oxide film ($In_2O_3$ film) 20 is formed by depositing an indium film (In film) 10 nm thick on the above ITO film 2 by the vacuum evaporation and then annealing at 400° C. for 60 minutes in the air.

Figure 2D:
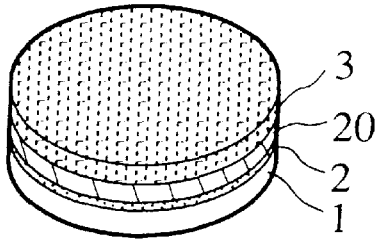

(3) Thereafter, as shown in FIG. 2D, an n-type semiconductor layer (n-type CdS layer) is formed 80 nm thick on the $In_2O_3$ film 20 by the vacuum evaporation method at a substrate temperature of 150° C.

Figure 2E:
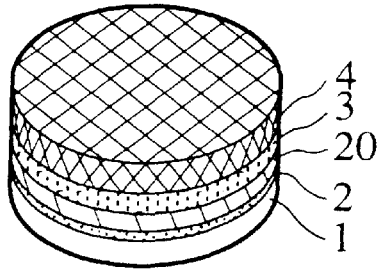

(4) Subsequently, as shown in FIG. 2E, a CdTe layer 4 serving as a p-type semiconductor layer is formed 4 $\mu$m thick by the vacuum evaporation method at a substrate temperature of 350° C. Vacuum evaporation of the CdS layer 3 and vacuum evaporation of the CdTe layer 4 may be carried out successively in the same chamber. Sputtering or chemical vapor deposition method (CVD method) other than the vacuum evaporation method may be employed to form the CdTe layer. Not the CdTe layer, but Cd molecules and Te molecules with substantially equal molar number may be deposited on the CdS layer by the vacuum evaporation method, the sputtering method, or the CVD method (for purposes of illustration, the case where the CdTe layer is deposited will be explained hereinafter).

Figure 2F:
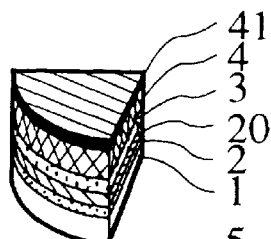

(5) Next, the glass substrate 1 on which the above CdTe layer/CdS layer is deposited is dipped into a methanol ($CH_3OH$) solution containing cadmium chloride ($CdCl_2$) and then dried by virtue of natural drying to thereby form a $CdCl_2$ layer 41, as shown in FIG. 2F. In turn, the CdTe layer on which the $CdCl_2$ layer 41 is formed is annealed at 400° C. for 15 minutes in an $N_2$ ambient or in the air. The solution used to dip may be prepared by melting $CdCl_2$ of 1.1 g into a methanol of 1 liter while stirring, and so on. The $CdCl_2$ film may be deposited or coated on the CdTe layer 4 by evaporation, sputtering, CVD, plating, spray method, or the like, in place of the method dipping the substrate into the methanol solution containing $CdCl_2$. In stead of the $CdCl_2$ film, chloride such as HCl, $NH_4Cl$, etc. or chlorine ($Cl_2$) may be attached on the surface of the CdTe layer. Although the annealing temperature is desired to be set to 400° C., annealing may be carried out in the temperature range of 350 to 600° C. This annealing is carried out to form the polycrystal CdTe layer with larger grain sizes, but the annealing temperature of 350° C. or less is not preferable because no enlargement of grain size is caused. The annealing of 600° C. or more is not applicable since the overall CdTe layer is sublimated if such annealing is carried out.

Figure 2G:
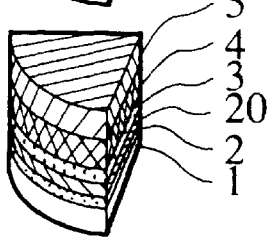
Figure 3:
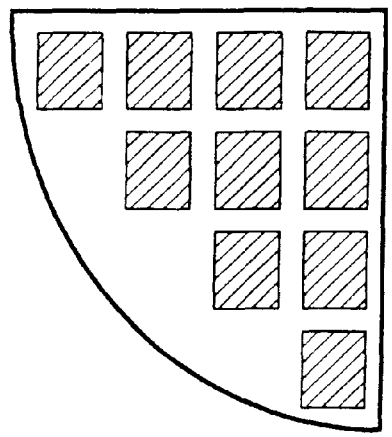
FIG. 3 is a plan view showing a state wherein cells are isolated on a glass substrate in the first embodiment of the present invention.
Figure 4:
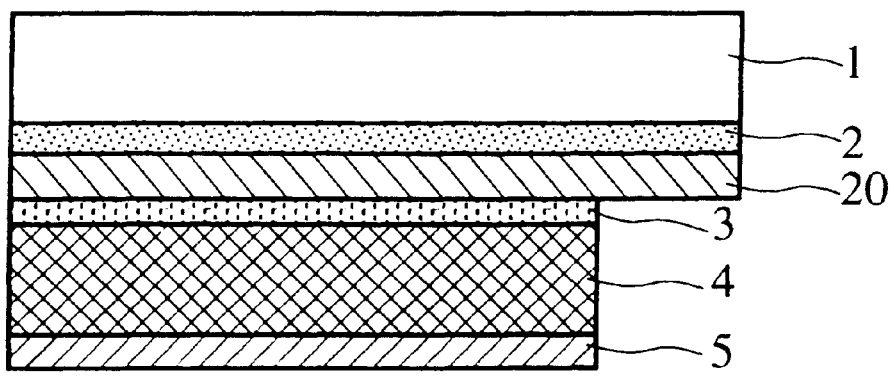
FIG. 4 is a schematic view showing a cross-sectional shape of the CdTe/CdS photovoltaic cell according to the first embodiment of the present invention.

(6) In the end, after a predetermined pretreatment, e.g., slight etching of a surface of the CdTe layer with the use of an etching solution such as a $K_2Cr_2O_7+H_2SO_4+H_2O$ solution, is carried out, as shown in FIG. 2G, an ohmic electrode 5 is formed by forming a 10 nm thick Cu and a 100 nm thick Au successively by the vacuum evaporation, and then annealing at 150° C. for about one hour in the $N_2+O_2$ atmosphere or the air. Photovoltaic cells according to the first embodiment of the present invention can be then completed as shown in FIG. 3 if the resultant structure is separated into photovoltaic cells of a predetermined size such as 5 mm×5 mm by use of photolithography. FIG. 4 is a schematic sectional view showing the photovoltaic cells according to the first embodiment of the present invention after having been finished.

TABLE 1

Differences in cell characteristics between the prior art and the first embodiment of the present invention

|  | Voc(V) | Isc(mA/cm$^2$) | FF(%) | Eff(%) |
|---|---|---|---|---|
| Prior Art | 0.62–0.71 | 23–25 | 54–59 | 8.2–10.1 |
| Present invention | 0.78–0.82 | 24–25 | 62–73 | 11.1–14.5 |

Table 1 indicates comparison of various characteristics of the photovoltaic cells manufactured according to the prior art and the present invention respectively. It would be appreciated that the open-circuit voltage Voc and the fill factor FF can be improved according to the present invention.

Figure 5A:
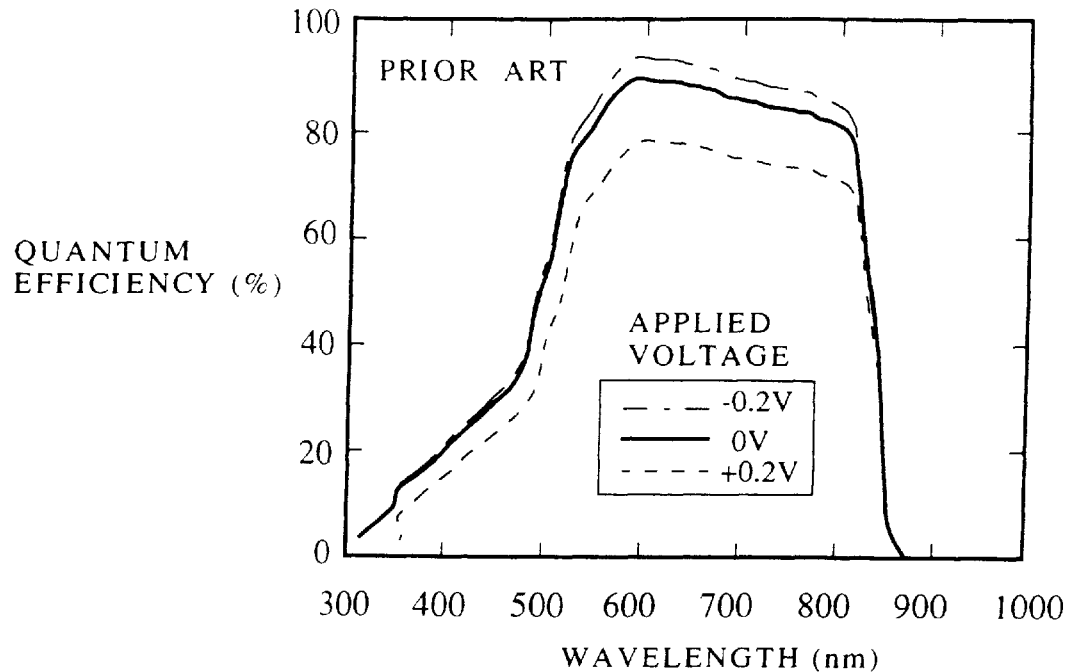
FIG. 5A is a view showing a spectral-response characteristic of the photovoltaic cell in the prior art.
Figure 5B:
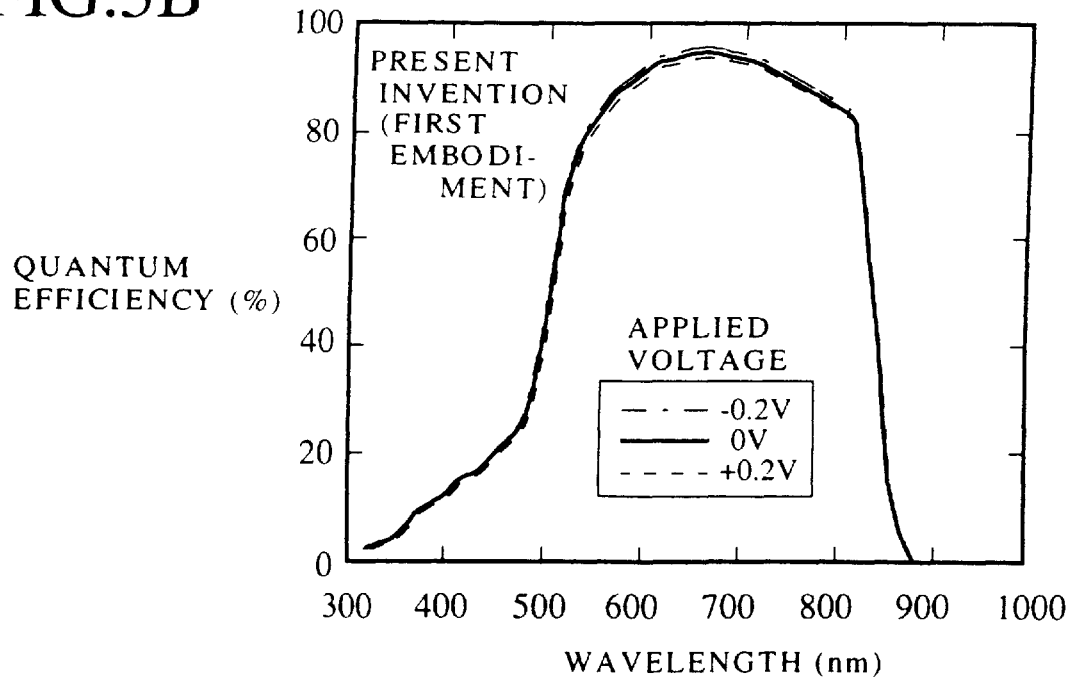
FIG. 5B is a view showing a spectral-response characteristic of the CdTe/CdS photovoltaic cell according to the first embodiment of the present invention, which corresponds to this.

FIG. 5B is a view showing a spectral-response characteristic of the photovoltaic cell according to the present invention, while comparing with a spectral-response characteristic (FIG. 5A) of the photovoltaic cell in the prior art, when an applied voltage is varied. As shown in FIG. 5A, the spectral-response characteristic of the photovoltaic cell manufactured in the prior art shows a fact that quantum efficiency is significantly reduced when small forward voltage is applied. The fact means that there exist a large number of defects to trap minority carriers when an electric field applied to the vicinity of the CdS/CdTe junction (in the depletion layer) is small. On the contrary, in the photovoltaic cell manufactured by the manufacturing method according to the first embodiment of the present invention, as shown in FIG. 5B, there is no reduction in quantum efficiency when the forward voltage is applied. Thus it can be deduced that characteristics at the CdS/CdTe interface and crystallographic quality are good enough.

It is of course that CdZnS, ZnS, etc. may be utilized as the n-type semiconductor layer 3 and that CuInSe$_2$, CuInGaSeS, etc. may be utilized as the p-type semiconductor layer 4. Also, the SnO$_2$ film or the ITO film which is formed by oxidizing the tin film (Sn film) or the indium-tin alloy film (In-Sn alloy film) being formed by virtue of the evaporation may be utilized in place of the In$_2$O$_3$ film 20.

(Second Embodiment)

The feature of a second embodiment of the present invention lies in the step of attaching the CdCl$_2$ onto the surface of CdTe layer. Namely, at above-mentioned step (5) among the CdTe/CdS photovoltaic cell manufacturing steps in the first embodiment, a substrate having the CdTe layer thereon is put into a sealed vessel, which shuts off the outside air, after the methanol solution containing CdCl$_2$ is coated on the surface of the CdTe layer, and then the substrate is warmed in the sealed vessel. If the methanol solution containing CdCl$_2$ is coated and then dried by virtue of natural drying, like the first embodiment, it is difficult to attach a large amount of CdCl$_2$ of more than 0.1 mg/cm$^2$ on the surface of the CdTe layer. Furthermore, if such substrate is warmed merely in the air, a drying time can be shortened but the inplane uniformity is degraded. Therefore, in order to improve the inplane uniformity in the second embodiment, the CdCl$_2$ can be attached to the surface of the CdTe layer by putting the substrate into the vessel which shuts off the outside air and then warming the vessel, as will be described hereunder.

The manufacturing method according to the second embodiment of the present invention is in brief similar to the first embodiment. In other words, (1) After the glass substrate such as the Corning 7059 substrate is cleaned, the ITO film or the SnO$_2$ film is formed 200 nm thick by the sputtering method, etc. (see FIG. 2B). The In$_2$O$_3$ film is then formed by depositing the In film 10 nm thick on this ITO film (or the SnO$_2$ film) by the vacuum evaporation and then annealing at 370° C. for 30 minutes in the air (see FIG. 2C). The SnO$_2$ film may be formed by depositing the Sn film in place of the In film 10 nm thick on the ITO film by the vacuum evaporation. The n-type CdS layer is then formed 150 nm thick on the In$_2$O$_3$ film (or the SnO$_2$ film) at the substrate temperature of 350° C. by the vacuum evaporation (see FIG. 2D). In turn, the CdTe layer 4 is formed 4 μm thick at the substrate temperature of 350° C. by the vacuum evaporation, the sputtering method, the CVD method, or the like (see FIG. 2E).

(2) Next, the substrate on which the p-type CdTe layer/the n-type CdS layer are formed is put into the schale, then a surface of the resultant structure is coated with the CdCl$_2$ contained methanol solution by use of a pipette, and then the lid is put on the schale. The schale is then placed in an oven and then warmed at 80° C. for four minutes. A solution which is coated by use of the pipette may be prepared by melting the CdCl$_2$ of 1.1 g into the methanol (CH$_3$OH) of 1 liter, and so on.

(3) Succeeding steps are similar to those in the first embodiment. In other words, if the ohmic electrode is formed by a predetermined pre-treatment and the resultant structure is then separated into cells of predetermined size, the CdTe/CdS photovoltaic cells according to the second embodiment of the present invention can be completed.

Characteristics of the photovoltaic cells according to the second embodiment of the present invention and manufactured as above are indicated in a Table 2, while comparing with those of the photovoltaic cells in the prior art. Sample numbers 1, 2, and 5 provide the characteristics of the photovoltaic cells in the prior art whereas sample numbers 3, 4, and 6 provide the characteristics of the photovoltaic cells according to the second embodiment of the present invention.

TABLE 2

Difference in cell characteristics between the prior art and the second embodiment of the present invention

| Smpl. No. | Trans. Cond. Film | Oxide Film Buffer | Voc(V) | Isc (mA/cm$^2$) | FF(%) | Eff(%) |
|---|---|---|---|---|---|---|
| 1 | ITO | none | 0.75–0.77 | 23.5–23.8 | 62.3–66.1 | 11.0–10.1 |
| 2 | (~10Ω/Sq) | SnO$_2$ (sputter, 10 nm) | 0.75–0.78 | 23.9–24.7 | 83.5–68.0 | 11.9–13.0 |

TABLE 2-continued

Difference in cell characteristics
between the prior art and the second embodiment of the present invention

| Smpl. No. | Trans. Cond. Film | Oxide Film Buffer | Voc(V) | Isc (mA/cm$^2$) | FF(%) | Eff(%) |
|---|---|---|---|---|---|---|
| 3 | | In evap.→oxid. (10 nm) | 0.82–0.84 | 24.5–24.9 | 71.4–78.6 | 14.5–16.0 |
| 4 | | Sn evap.→oxid. (10 nm) | 0.83–0.84 | 23.8–24.0 | 72.1–73.9 | 14.4–14.7 |
| 5 | SnO$_2$ | none | 0.71–0.81 | 23.8–25.1 | 63.8–70.1 | 11.5–12.9 |
| 6 | (~10Ω/Sq) | In evap.→oxid. (10 nm) | 0.81–0.83 | 23.2–24.3 | 72.1–75.4 | 13.8–14.3 |

In case no oxide film buffer is provided (sample numbers 1 and 5), the conversion efficiency is at the lowest and the open-circuit voltage Voc, etc. are small. In case the SnO$_2$ film is formed directly on the ITO film by the sputtering method (sample number 3), the conversion efficiency is in the range of 11.9 to 13.0% and the open-circuit voltage Voc is in the range of 0.75–0.78 V. In contrast, according to the second embodiment of the present invention, the conversion efficiency can be improved up to 13.8 to 16.0% if the oxide film buffer is formed by depositing the In film by virtue of the vacuum evaporation and then oxidizing the In film (sample numbers 3, 6), or else by depositing the Sn film by virtue of the vacuum evaporation and then oxidizing the Sn film (sample number 4). In addition, it would be found that the open-circuit voltage Voc, the short-circuit current Isc, and the fill factor FF can be improved rather than the prior art.

Figure 6:
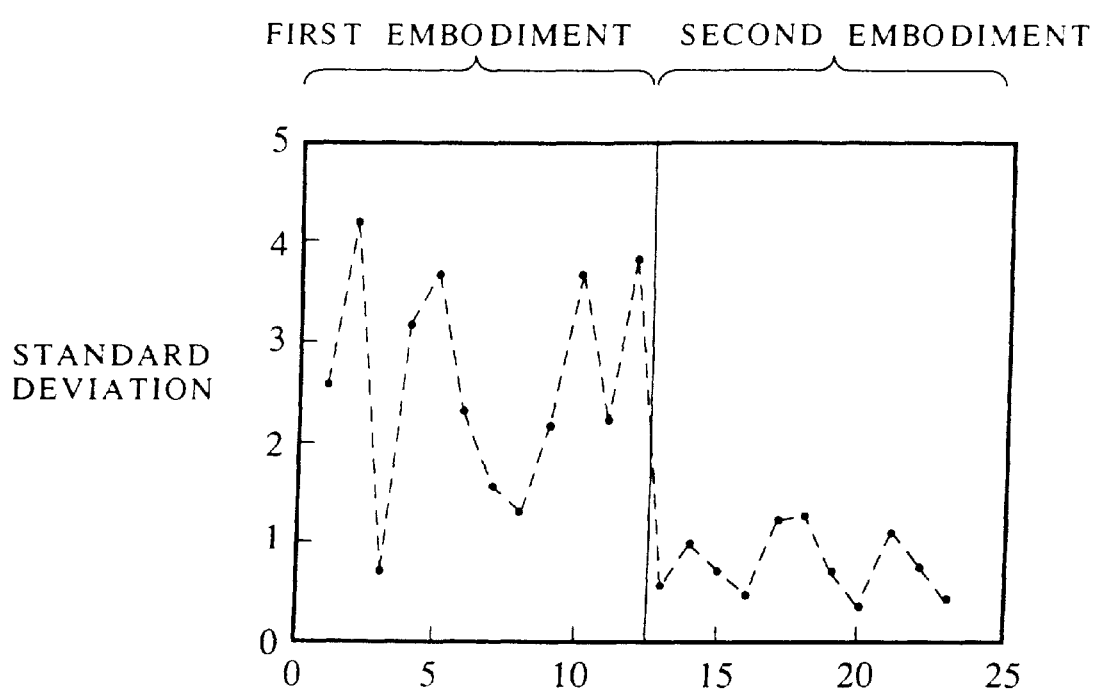
FIG. 6 is a view showing standard deviation in conversion efficiency of a CdTe/CdS photovoltaic cell according to a second embodiment of the present invention, while comparing with that in the first embodiment.

FIG. 6 is a view illustrating standard deviation in the conversion efficiency of the CdTe/CdS photovoltaic cell according to the second embodiment of the present invention. In FIG. 6, standard deviation in the conversion efficiency of the CdTe/CdS photovoltaic cell which is coated with a large amount of the methanol solution containing CdCl$_2$ and then dried by natural drying according to the first embodiment is also shown. It can be deduced from FIG. 6 that standard deviation in the conversion efficiency of the photovoltaic cell according to the second embodiment of the present invention can be reduced in contrast to the first embodiment. In this case, the conversion efficiency of the photovoltaic cell according to the first embodiment is an average of 13.3% while the conversion efficiency of the sample shown in FIG. 6 is an average of 14.6%, which shows an improvement in the conversion efficiency.

Furthermore, it takes 30 minutes to dry the methanol solution in the method employing the natural drying according to the first embodiment whereas only four minutes are needed to dry the methanol solution in the second embodiment.

In the above description, though the case the annealing temperature is set to 80° C. has been explained, such temperature need not be limited to 80° C. and can be selected appropriately in the range of 50° C. to 100° C. A too much drying time will be required if the annealing temperature is less than 50° C., while the annealing temperature in excess of 100° C. is not preferable because the inplane uniformity is degraded.

Still further, though the schale is exemplified as the sealed vessel which shuts off the outside air, another vessel which is equivalent in structure to the schale, a perfectly sealed receptacle, etc. may be employed. It is preferable to pave the sealed vessel with hygroscopic material such as silica gel.

After a gas introducing port and a gas exhaust port are provided to the hermetically sealed vessel, the hermetically sealed vessel may be warmed while flowing dry air (N$_2$+O$_2$), dry N$_2$ gas, high purity N$_2$ gas, or the like through the hermetically sealed vessel.

Besides, chloride such as Cl$_2$, HCl, or NH$_4$Cl other than CdCl$_2$ may be employed.

As described earlier, according to the second embodiment of the present invention, a large amount of chloride such as CdCl$_2$ can be attached on a surface of the CdTe layer with good inplane uniformity in a short time, the conversion efficiency of the photovoltaic cell can be enhanced, and standard deviation in the conversion efficiency can be made small.

As also described above, it would be evident that various characteristics of the CdTe/CdS photovoltaic cell can be improved according to the present invention.

In the second embodiment of the present invention, the n-type semiconductor layer is not limited to CdS but CdZnS, ZnS, or the like may be employed. Moreover, it is of course that the p-type semiconductor layer 4 is not limited to CdTe but CuInSe$_2$, CuInGaSeS, or the like may be employed. In place of the In$_2$O$_3$ film, the SnO$_2$ film or the ITO film may be employed which can be formed respectively by forming the Sn film or the In-Sn alloy film by virtue of vacuum evaporation and then oxidizing the Sn film or the In-Sn alloy film.

Like the above, although the present invention has been set forth with reference to the first and second embodiments, it should not be understood that the present invention is limited by such descriptions and drawings constituting a part of this disclosure. From this disclosure, it is evident for one skilled in the art that various alternative embodiments and application techniques may be adopted. In this manner, it would be understood that the present invention may contain various embodiment not referred to herein. Accordingly, the present invention is to be defined only by the configuration set forth in the appropriate appended claims based on this disclosure.

INDUSTRIAL APPLICABILITY

As has been explained above, according to the present invention, the strain caused when the n-type and p-type semiconductor layers, constituting the photovoltaic cell, are grown in grain size can be suppressed by the presence of the indium oxide film (In$_2$O$_3$ film), the tin oxide film (SnO$_2$ film), or the indium-tin oxide film (ITO film) serving as a strain relaxation layer. Hence, good pn heterojunction such as CdS/CdTe junction can also be obtained, and performances of the photoelectric conversion device can be extremely improved.

In particular, by warming/drying the CdCl₂ contained methanol solution in the sealed vessel, a large amount of CdCl₂ can be formed uniformly on the p-type semiconductor layer and also the photoelectric conversion device with high conversion efficiency can be accomplished.

The present invention can make a beginning of the solution of energy problems that human beings are now confronted with. In other words, the present invention has important applicability in the energy industrial fields as alternative energy technology other than the hydrocarbon-based resource. For instance, the present invention can become the commencement to the technology which make possible manufacture of the photovoltaic cell to generate remote or relatively large scale distribution electric power. According to the present invention, it is feasible to manufacture the suitably efficient photovoltaic cell at low cost. Although a single crystal photovoltaic cell is employed in relatively greater part of the photoelectric conversion device of today, it has in essence a high ratio of cost/output watt. According to the present invention, the highly efficient polycrystal photovoltaic cell can be achieved at low cost. In other words, according to the present invention, material and manufacturing cost can be readily cut down. Therefore, the high efficiency and low cost polycrystal photovoltaic cell according to the present invention is also applicable to such industrial fields that need relatively low cost electrical power supply means at remote locations, such as telecommunication stations, agricultural water pumping sites, remote villages, and portable housing facilities. The technology according to the present invention, as a natural consequence, can discover the applicability in the technical fields such as future photovoltaic power plants which compete with conventional hydrocarbon consuming plants.

We claim:

1. A method of manufacturing a photoelectric conversion device comprising at least the steps of:
   (a) a first step of forming an indium oxide film, a tin oxide film, or an indium-tin oxide film by forming an indium film, a tin film, or an indium-tin alloy film on a transparent conductive substrate and then annealing at a temperature of more than 300° C. in oxygen containing atmosphere;
   (b) a second step of forming an n-type semiconductor layer on an indium oxide film, a tin oxide film, or an indium-tin alloy oxide film and then forming a p-type semiconductor layer on the n-type semiconductor layer; and
   (c) a third step of enlarging grain size of polycrystals of the p-type semiconductor layer.

2. The method of manufacturing a photoelectric conversion device according to claim 1, wherein a thickness of the indium film, the tin film, or the indium-tin alloy film is selected in a range of 2.5 nm to 100 nm.

3. The method of manufacturing a photoelectric conversion device according to claim 2, wherein the indium film, the tin film or the indium-tin alloy film is formed by a vacuum evaporation method.

4. The method of manufacturing a photoelectric conversion device according to claim 2, wherein the n-type semiconductor layer is formed of an n-type CdS layer, the p-type semiconductor layer is formed of a p-type CdTe layer, the third step is made up of steps of forming a chloride layer on the p-type CdTe layer and then annealing.

5. The method of manufacturing a photoelectric conversion device according to claim 4, wherein the chloride layer formed in the third step is formed of a cadmium chloride layer.

6. The method of manufacturing a photoelectric conversion device according to claim 2, wherein the transparent conductive substrate is formed of a predetermined transparent substrate on which a transparent conductive film is formed.

7. The method of manufacturing a photoelectric conversion device according to claim 2, wherein the thickness of the indium film, the tin film, or the indium-tin alloy film is selected in a range of 2.5 nm to 50 nm.

8. The method of manufacturing a photoelectric conversion device according to claim 7, wherein the indium film, the tin film or the indium-tin alloy film is formed by a vacuum evaporation method.

9. The method of manufacturing a photoelectric conversion device according to claim 7, wherein the n-type semiconductor layer is formed of an n-type CdS layer, the p-type semiconductor layer is formed of a p-type CdTe layer, the third step is made up of steps of forming a chloride layer on the p-type CdTe layer and then annealing.

10. The method of manufacturing a photoelectric conversion device according to claim 9, wherein the chloride layer formed in the third step is formed of a cadmium chloride layer.

11. The method of manufacturing a photoelectric conversion device according to claim 7, wherein the transparent conductive substrate is formed of a predetermined transparent substrate on which a transparent conductive film is formed.

12. The method of manufacturing a photoelectric conversion device according to claim 1, wherein the indium film, the tin film or the indium-tin alloy film is formed by a vacuum evaporation method.

13. The method of manufacturing a photoelectric conversion device according to claim 1, wherein the n-type semiconductor layer is formed of an n-type CdS layer, the p-type semiconductor layer is formed of a p-type CdTe layer, the third step is made up of steps of forming a chloride layer on the p-type CdTe layer and then annealing.

14. The method of manufacturing a photoelectric conversion device according to claim 13, wherein the chloride layer formed in the third step is formed of a cadmium chloride layer.

15. The method of manufacturing a photoelectric conversion device according to claim 1, wherein the transparent conductive substrate is formed of a predetermined transparent substrate on which a transparent conductive film is formed.

* * * * *